(12) United States Patent
Saboundji et al.

(10) Patent No.: US 11,078,567 B2
(45) Date of Patent: Aug. 3, 2021

(54) PROCESS FOR MANUFACTURING A PART MADE OF NICKLE-BASED SUPERALLOY CONTAINING HAFNIUM

(71) Applicant: SAFRAN, Paris (FR)

(72) Inventors: Amar Saboundji, Moissy-Cramayel (FR); Virginie Jaquet, Moissy-Cramayel (FR)

(73) Assignee: SAFRAN, Paris (FR)

( * ) Notice: Subject to any disclaimer, the term of this patent is extended or adjusted under 35 U.S.C. 154(b) by 227 days.

(21) Appl. No.: 16/308,245

(22) PCT Filed: Jun. 9, 2017

(86) PCT No.: PCT/FR2017/051475
§ 371 (c)(1),
(2) Date: Dec. 7, 2018

(87) PCT Pub. No.: WO2017/212195
PCT Pub. Date: Dec. 14, 2017

(65) Prior Publication Data
US 2019/0153591 A1 May 23, 2019

(30) Foreign Application Priority Data

Jun. 10, 2016 (FR) ...................................... 1655343

(51) Int. Cl.
*C23C 14/58* (2006.01)
*C23C 10/28* (2006.01)
*C22C 19/05* (2006.01)
*C23C 14/16* (2006.01)

(52) U.S. Cl.
CPC ........ *C23C 14/5846* (2013.01); *C22C 19/057* (2013.01); *C23C 10/28* (2013.01); *C23C 14/165* (2013.01)

(58) Field of Classification Search
CPC . C22C 19/057; C23C 14/5846; C23C 14/165; C23C 10/28
See application file for complete search history.

(56) References Cited

U.S. PATENT DOCUMENTS 6,419,763 B1 * 7/2002 Konter .................. C22C 19/056
148/404

FOREIGN PATENT DOCUMENTS

| EP | 0 718 420 A1 | 6/1996 |
| EP | 0 821 078 A1 | 1/1998 |
| EP | 1 010 774 A1 | 6/2000 |
| EP | 1 036 850 A1 | 9/2000 |
| EP | 1 447 457 A1 | 8/2004 |
| EP | 2 239 351 A1 | 10/2010 |

OTHER PUBLICATIONS

International Search Report for PCT/FR2017/051475 dated Aug. 8, 2017 [PCT/ISA/210].
Preliminary Search Report for FR 1655343 dated Mar. 30, 2017.

* cited by examiner

*Primary Examiner* — Jessee R Roe
(74) *Attorney, Agent, or Firm* — Sughrue Mion, PLLC

(57) ABSTRACT

The invention relates to a process for manufacturing a part made of nickel-based monocrystalline superalloy containing hafnium. This process is noteworthy in that it comprises the following successive steps consisting in: —manufacturing a nickel-based monocrystalline superalloy that is not doped with hafnium, —manufacturing a part from this superalloy, —directly depositing on said part a layer of hafnium having a thickness of between 50 nm and 800 nm, —carrying out a diffusion treatment of the hafnium so as to form an interdiffusion layer at the surface of said part and to thus obtain a part made of nickel-based monocrystalline superalloy containing hafnium.

19 Claims, No Drawings

PROCESS FOR MANUFACTURING A PART MADE OF NICKLE-BASED SUPERALLOY CONTAINING HAFNIUM

CROSS REFERENCE TO RELATED APPLICATIONS

This application is a National Stage of Application No. PCT/FR2017/051,475 filed Jun. 9, 2017, claiming priority based on French Patent Application No. 1655343 filed Jun. 10, 2016, the disclosures of each of which are incorporated by reference herein in their entireties.

GENERAL TECHNICAL FIELD

The present invention concerns a process for manufacturing hafnium-containing nickel-based superalloys.

STATE OF THE ART

Nickel-based superalloys are already known in the state of the art.

The term "superalloys" refers to complex alloys which, at high temperature and pressure, exhibit very good resistance to oxidation, corrosion, creep and cyclic stresses (notably mechanical or thermal). A particular application of these superalloys is in the manufacture of parts used in aeronautics, such as turbine blades.

Superalloys can be hardened by a so-called "solutioning" treatment. Such treatment consists in heating the alloy to an appropriate high temperature, below the eutectic temperature, and maintaining this temperature long enough to homogenize the elemental concentrations of its constituents and control the size of the intermetallic precipitates. This optimizes the microstructural properties of the material.

In order to further improve the oxidation resistance of nickel-based superalloys, hafnium is deliberately added thereto. However, the presence of hafnium in the superalloy makes the complete or almost complete solutioning of the eutectics more difficult and leads to burn defects.

PRESENTATION OF THE INVENTION

The objective of the invention is therefore to overcome the above-mentioned disadvantages of the state of the art and to propose a process for manufacturing a hafnium-containing nickel-based superalloy which produces a superalloy that retains the beneficial role of hafnium in improving oxidation and corrosion resistance but without having the disadvantages of difficult solutioning.

To that end, the invention concerns a process for manufacturing a hafnium-containing nickel-based single-crystal superalloy part.

In accordance with the invention, this process includes the following successive steps consisting in:
- manufacturing a nickel-based, non-hafnium-doped, single-crystal superalloy,
- manufacturing a part from this superalloy,
- depositing, directly on said part, a layer of hafnium having a thickness comprised between 50 nm and 800 nm,
- carrying out a diffusion treatment of the hafnium so as to form an interdiffusion layer on the surface of said part, and thereby obtain a hafnium-containing nickel-based single-crystal superalloy part.

By virtue of these features of the invention, the superalloy obtained has improved mechanical properties thanks to an almost complete or improved solutioning of the eutectics while maintaining good resistance to oxidation and corrosion. The use of a layer of pure hafnium further enhances this oxidation resistance.

According to other advantageous and non-limiting features of the invention, taken alone or in combination:
- the non-hafnium-doped nickel-based single-crystal superalloy comprises in mass percent:
  - 5.2% aluminium, 6.5% cobalt, 7.8% chromium, 2% molybdenum, 7.9% tantalum, 1.1% titanium, 5.7% tungsten and the remainder nickel or
  - 5.6% aluminium, 9.6% cobalt, 6.5% chromium, 0.6% molybdenum, 3% rhenium, 6.5% tantalum, 1% titanium, 6% tungsten and the remainder nickel or
  - 5.73% aluminium, 9.6% cobalt, 3.46% chromium, 0.6% molybdenum, 4.9% rhenium, 8.3% tantalum, 0.9% titanium, 5.5% tungsten and the remainder nickel or
  - 5.7% aluminium, 3% cobalt, 2% chromium, 0.4% molybdenum, 6% rhenium, 8% tantalum, 0.2% titanium, 5% tungsten, 0.1% niobium and the remainder nickel or
  - 5.8% aluminium, 12.5% cobalt, 4.2% chromium, 1.4% molybdenum, 5.4% rhenium, 7.2% tantalum, 6% tungsten and the remainder nickel or
  - 6% aluminium, less than 0.2% cobalt, 4% chromium, 1% molybdenum, 4% rhenium, 5% tantalum, 0.5% titanium, 5% tungsten, 4% ruthenium and the remainder nickel.

DETAILED DESCRIPTION

The process in accordance with the invention consists, first, in manufacturing a nickel-based, non-hafnium-doped, single-crystal superalloy. "Non-hafnium-doped" means hafnium-free.

Table 1 below gives several preferential exemplary superalloys useful in the process in accordance with the invention. They are identified by the letters A to F. Other non-hafnium-doped nickel-based single-crystal superalloys may also be used.

TABLE 1

Exemplary hafnium-free nickel-based single-crystal superalloys

| | | Alloy elements (mass percentages) | | | | | | | | | |
|---|---|---|---|---|---|---|---|---|---|---|---|
| | Ni | Al | Co | Cr | Mo | Re | Ta | Ti | W | Cb | Ru |
| A | Remainder | 5.2 | 6.5 | 7.8 | 2 | 0 | 7.9 | 1.1 | 5.7 | | |
| B | Remainder | 5.6 | 9.6 | 6.5 | 0.6 | 3 | 6.5 | 1 | 6 | | |
| C | Remainder | 5.73 | 9.6 | 3.46 | 0.6 | 4.87 | 8.28 | 0.86 | 5.5 | | |
| D | Remainder | 5.7 | 3 | 2 | 0.4 | 6 | 8 | 0.2 | 5 | 0.1 | |

TABLE 1-continued

Exemplary hafnium-free nickel-based single-crystal superalloys

Alloy elements (mass percentages)

| | Ni | Al | Co | Cr | Mo | Re | Ta | Ti | W | Cb | Ru |
|---|---|---|---|---|---|---|---|---|---|---|---|
| E | Remainder | 5.8 | 12.5 | 4.2 | 1.4 | 5.4 | 7.2 | 0 | 6 | | |
| F | Remainder | 6 | <0.2 | 4 | 1 | 4 | 5 | 0.5 | 5 | | 4 |

The term "remainder" corresponds, for each superalloy, to the residual mass percentage to reach 100% with the various other components mentioned.

A part with a desired shape is then formed from such a superalloy, for example by casting or additive manufacturing.

Preferably, the resulting part is then subjected to a solutioning treatment, as described above in the introduction.

Preferably, this treatment consists of a first step of temperature increase until reaching a temperature of about 1100° C. for a period comprised between a few minutes and 4 hours, followed by a second step of temperature increase until reaching a temperature of about 1200° C. for a period comprised between a few minutes and 4 hours, and finally a third step of temperature increase until reaching a temperature of about 1300° C. for a period comprised between a few minutes and 4 hours.

A layer of hafnium, i.e. either a layer of pure hafnium (100 atomic % hafnium) or a layer containing at least 99.99 atomic % hafnium, is then deposited on the part thus manufactured. This layer is preferably nanocrystalline or microcrystalline. Preferably, this layer has a thickness comprised between 50 nm and 800 nm, more preferably comprised between 50 nm and 300 nm.

The deposition of this layer of hafnium can be carried out by physical vapour deposition (PVD), preferably by cathode sputtering. This allows good control of the deposited thickness.

Mention may also be made of the use of electron beam physical vapour deposition (EBPVD), evaporation, pulsed laser ablation or cathode sputtering. The latter technique has the advantage of allowing the formation of dense films of nanometric or micrometric thickness and having superior adhesion to the preceding layer than that obtained with other deposition techniques.

PVD is carried out inside an enclosure containing the part and one or more targets corresponding to the material(s) to be deposited, here notably hafnium. Under the application of a potential difference between the reactor walls and the target(s), a plasma is formed whose positive species are attracted to the cathode (target) and collide therewith. The atoms of the target(s) are sputtered and then condense on said part.

Preferably, the deposition conditions are as follows:
Heating during deposition: from 100 to 900° C.
Pressure: from 0.1 Pa to 1 Pa
Power density: 2 to 15 W/cm$^2$
Polarization: −500V to −150V
Ion bombardment is carried out for 10 to 30 minutes between −200V and 500V.

Deposition of the layer of hafnium can also be carried out by chemical vapour deposition (CVD).

Examples of chemical vapour deposition (CVD) techniques include:
plasma enhanced chemical vapour deposition (PECVD),
low-pressure chemical vapour deposition (LPCVD),
ultra-high vacuum chemical vapour deposition (UHVCVD),
atmospheric pressure chemical vapour deposition (APCVD),
atomic layer chemical vapour deposition (ALCVD),
chemical vapour aluminizing (CVA).

Said part is then subjected to a hafnium diffusion treatment, so as to form, on the surface of said part, an interdiffusion layer in which hafnium is present.

Preferably, the diffusion treatment is carried out by placing the part coated with the layer of hafnium inside an enclosure, bringing it under vacuum or introducing within it an atmosphere containing a mixture of 95% by volume argon and 5% by volume helium, and then carrying out the heat treatment described below.

Preferably, this heat treatment comprises a phase of temperature increase until a temperature comprised between 500° C. and 1200° C. is reached, a phase of maintaining this temperature stage for a period of 1 hour to 4 hours and a cooling phase which consists in reducing the temperature inside the enclosure until it returns to room temperature.

The process in accordance with the invention has many advantages, which are listed below.

During the first step of the process, the production of a non-hafnium-doped nickel-based single-crystal superalloy and its use for manufacturing a part do not present difficulties.

In contrast, in the state of the art (hafnium-doped superalloy), the shaping of the part, notably by casting, resulted, during its solidification, in hafnium losses that differed according to the part's geometry or solidification time. Similarly, this part was at risk of oxidizing (formation of hafnium oxide). This is not the case with the process of the invention since there is no hafnium at this stage.

During the solutioning step, the homogenization of the part's components and the re-solutioning of the superalloy are optimal.

During chemical attacks carried out as part of the non-destructive testing of parts, there is no preferential attack of residual eutectics.

Finally, the subsequent deposition of the layer of hafnium and its diffusion result in the formation of a more robust part, with better mechanical strength via almost complete or improved solutioning of the eutectics and better resistance to oxidation and corrosion.

The invention claimed is:
1. A process for manufacturing a hafnium-containing nickel-based single-crystal superalloy part, wherein the process comprises the following successive steps:
manufacturing a nickel-based, non-hafnium-doped, single-crystal superalloy,
manufacturing a part from this superalloy,
depositing, directly on said part, a layer of nanocrystalline or microcrystalline hafnium having a thickness comprised between 50 nm and 800 nm, carrying out a hafnium diffusion treatment so as to form an interdiffusion layer on the surface of said part, and thereby obtain a hafnium-containing nickel-based single-crystal superalloy part.

2. The process according to claim 1, wherein the deposition of the layer of hafnium is carried out by physical vapour deposition (PVD).

3. The process according to claim 2, wherein the deposition of the layer of hafnium is carried out by cathode sputtering.

4. The process according to claim 1, wherein the deposition of the layer of hafnium is carried out by chemical vapour deposition (CVD).

5. The process according to claim 1, wherein the layer of hafnium deposited on said part has a thickness comprised between 50 nm and 300 nm.

6. The process according to claim 1, wherein the hafnium diffusion treatment is carried out under vacuum or under a mixture of 95% by volume argon and 5% by volume helium, by carrying out a temperature increase until bringing said part to a temperature comprised between 500° C. and 1,200° C., maintaining this temperature for 1 hour to 4 hours and cooling said part until it returns to room temperature.

7. The process according to claim 1, wherein the non-hafnium-doped nickel-based single-crystal superalloy comprises in mass percent 5.2% aluminium, 6.5% cobalt, 7.8% chromium, 2% molybdenum, 7.9% tantalum, 1.1% titanium, 5.7% tungsten and the remainder nickel.

8. The process according to claim 1, wherein the non-hafnium-doped nickel-based single-crystal superalloy comprises in mass percent 5.6% aluminium, 9.6% cobalt, 6.5% chromium, 0.6% molybdenum, 3% rhenium, 6.5% tantalum, 1% titanium, 6% tungsten and the remainder nickel.

9. The process according to claim 1, wherein the non-hafnium-doped nickel-based single-crystal superalloy comprises in mass percent 5.73% aluminium, 9.6% cobalt, 3.46% chromium, 0.6% molybdenum, 4.9% rhenium, 8.3% tantalum, 0.9% titanium, 5.5% tungsten and the remainder nickel.

10. The process according to claim 1, wherein the non-hafnium-doped nickel-based single-crystal superalloy comprises in mass percent 5.7% aluminium, 3% cobalt, 2% chromium, 0.4% molybdenum, 6% rhenium, 8% tantalum, 0.2% titanium, 5% tungsten, 0.1% niobium and the remainder nickel.

11. The process according to claim 1, wherein the non-hafnium-doped single-crystal nickel-based superalloy comprises in mass percent 5.8% aluminium, 12.5% cobalt, 4.2% chromium, 1.4% molybdenum, 5.4% rhenium, 7.2% tantalum, 6% tungsten and the remainder nickel.

12. The process according to claim 1, wherein the non-hafnium-doped nickel-based single-crystal superalloy comprises in mass percent 6% aluminium, less than 0.2% cobalt, 4% chromium, 1% molybdenum, 4% rhenium, 5% tantalum, 0.5% titanium, 5% tungsten, 4% ruthenium and the remainder nickel.

13. The process according to claim 1, wherein the non-hafnium-doped nickel-based single-crystal superalloy comprises nickel, aluminium, cobalt, chromium, molybdenum, tantalum and tungsten.

14. The process according to claim 1, wherein the non-hafnium-doped nickel-based single-crystal superalloy comprises in mass percent about 5.2% to 6% aluminium, about 0.2% to 12.5% cobalt, about 2% to 7.8% chromium, about 0.4% to 2% molybdenum, about 5% to 8% tantalum and about 5% to 6% tungsten.

15. The process according to claim 1, wherein the part is manufactured from the non-hafnium-doped nickel-based single-crystal superalloy by casting or additive manufacturing.

16. The process according to claim 1, wherein the deposited layer of hafnium is a layer containing at least 99.99 atomic percent of hafnium.

17. The process according to claim 1, wherein after the manufacturing step of the part from the non-hafnium-doped nickel-based single-crystal superalloy and before the depositing step of the layer of hafnium, the manufactured part is subjected to a solutioning treatment.

18. The process according to claim 17, wherein the solutioning treatment consists of a first step of temperature increase until reaching a temperature of about 1,100° C. for a period comprised between a few minutes and 4 hours, followed by a second step of temperature increase until reaching a temperature of about 1,200° C. for a period comprised between a few minutes and 4 hours, and finally a third step of temperature increase until reaching a temperature of about 1,300° C. for a period comprised between a few minutes and 4 hours.

19. The process according to claim 1, wherein the deposition of the layer of hafnium is carried out by a technique selected from low-pressure chemical vapour deposition (LPCVD), chemical vapour aluminizing (CVA), ultra-high vacuum chemical vapour deposition (UHVCVD), plasma enhanced chemical vapour deposition (PECVD), atmospheric pressure chemical vapour deposition (APCVD), and atomic layer chemical vapour deposition (ALCVD).

* * * * *